US006337976B1

(12) United States Patent
Kudou (10) Patent No.: US 6,337,976 B1
(45) Date of Patent: Jan. 8, 2002

(54) SELECTIVE-CALLING RADIO RECEIVER USING DIRECT CONVERSION METHOD

(75) Inventor: Hiroshi Kudou, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/215,563

(22) Filed: Dec. 18, 1998

(30) Foreign Application Priority Data

Dec. 18, 1997 (JP) .............................. 9-365374

(51) Int. Cl.[7] .................................. H04B 1/26
(52) U.S. Cl. .................... 455/258; 455/165.1; 455/318; 455/323; 455/324
(58) Field of Search .............................. 455/139, 164.1, 455/164.2, 165.1, 183.1, 190.1, 76, 86, 324, 306, 313, 318, 319, 323, 255–265; 333/129; 375/216, 316

(56) References Cited

U.S. PATENT DOCUMENTS

| 5,530,929 | A | * | 6/1996 | Lindqvist et al. ............ 455/324 |
| 5,633,898 | A | | 5/1997 | Kishigami et al. |
| 5,949,830 | A | * | 9/1999 | Nakanishi .................... 455/260 |
| 5,983,081 | A | * | 11/1999 | Lehtinen ...................... 455/260 |
| 6,233,444 | B1 | * | 5/2001 | Nakanishi .................... 455/313 |

FOREIGN PATENT DOCUMENTS

| JP | 56-136041 | 10/1981 |
| JP | 8-317002 | 11/1996 |
| JP | 9-200070 | 7/1997 |

* cited by examiner

Primary Examiner—Lester G. Kincaid
(74) Attorney, Agent, or Firm—Young & Thompson (57) ABSTRACT

A selective-calling radio receiver using the direct conversion method is provided, which commonly uses a VCO and its neighboring component for different frequency bands. This receiver is comprised of (a) a PLL frequency synthesizer for generating an initial local signal; (b) an orthogonal converter for orthogonally converting a digitally-modulated received signal to a combination of first and second baseband signals having a phase difference of 90° using the initial local signal, the orthogonal converter including (b-1) a frequency multiplier for multiplying the initial local signal by a variable multiplication factor to produce a multiplied initial local signal, (b-2) a first phase shifter for producing first and second local signals having a phase difference of 90° from the multiplied initial local signal, (b-3) a first frequency mixer for mixing the first local signal with the received signal to produce the first baseband signal, and (b-5) a second frequency mixer for mixing the second local signal with the received signal to produce the second baseband signal; and (c) an orthogonal-converter controller for controlling a characteristic of the orthogonal converter according to a frequency of the received signal.

11 Claims, 5 Drawing Sheets

SELECTIVE-CALLING RADIO RECEIVER USING DIRECT CONVERSION METHOD

BACKGROUND OF THE INVENTION

1. Field of the Invention

The present invention relates to a selective-calling radio receiver such as a pager and more particularly, to a selective-calling radio receiver capable of receipt of signals in two or more different frequency bands.

2. Description of the Prior Art

In recent years, the parasitic capacitance of transistors has been decreased according to miniaturization of electronic elements and components integrated on Integrated circuits (ICs), thereby raising the transition frequency $f_T$ of the transistors. Under such the circumstances, the operating frequency of various circuits incorporated into ICs has been becoming higher.

A typical one of the selective-calling radio receivers is a portable receiver called a "pager" or "paging receiver". The paging receiver is usually equipped with a frequency synthesizer using a Phase-Locked Loop (PLL) circuit (i.e., a PLL frequency synthesizer) as a local oscillator or a carrier wave generator. Since a receiver circuit implemented in the conventional paging receiver needs to operate at a voltage as low as 1 V supplied by a dry battery, various PLL circuits capable of operation at a low voltage such as 1 V with low power dissipation have been developed and actually used for the PLL frequency synthesizer. A main part of the FLL circuit excluding a Voltage-Controlled Oscillator (VCO) and a low-pass filter is usually formed on an IC chip, which has been termed a "PLL IC".

Several years ago, the highest operating frequency of the PLL IC at a voltage of 1 V was approximately 100 MHz. However, recently, this highest operating frequency has been raised to approximately 200 to 300 MHz and at the same time, the power dissipation has become negligible in view of the receiver operation. This tendency seems to progress further in the future.

The increase of the operating frequency of the PLL IC means that the output frequency of the VCO is increased. Therefore, there is an advantage that the configuration of the PLL circuit is simplified. For example, a frequency multiplier or multipliers incorporated into the PLL IC may be unnecessary at specific frequencies, or the number of the frequency multiplication operations in the PLL IC maybe decreased. In this case, the carrier-to-noise ratio (C/N) degradation in the paging receiver is suppressed, which improves the performance or characteristics of the paging receiver.

Conventionally, the paging receiver typically uses the well-known "direct conversion method". In this method, the frequency of a received signal is directly converted to its baseband frequency without using any Intermediate Frequency (IF). Also, there is an advantage that an external filter is unnecessary to simplify the circuit configuration.

With the paging receiver using the direct conversion method, circuit parameter changes are required according to the frequency band of the received signal in (i) the VCO and the phase shifter in the local or carrier-wave oscillator and (ii) circuits from an antenna to a Radio-Frequency (RF) amplifier.

Therefore, if electronic components or parts relating to the VCO and the phase shifter in the carrier-wave oscillator and the circuits from the antenna to the RF amplifier can be commonly used for different frequency bands of a received signal, it is effective for components/parts management and production control in fabrication of the paging receivers of this sort.

Various prior-art receivers with the intention of common use of the components or parts have been developed and disclosed.

A first one of the prior-art receivers is disclosed in the Japanese Non-Examined Patent Publication No. 56-136041 published in Oct. 1981. This prior-art receiver is comprised of a single VCO provided in a PLL frequency synthesizer. This single VCO is commonly used for different frequency bands of a received signal, such as the Amplitude Modulation (AM) and Short Wave (SW) radio-broadcasting bands.

With the first prior-art receiver disclosed in the Japanese Non-Examined Patent Publication No. 56-136041, the output frequency of the single VCO circuit is multiplied and then, the frequency-multiplied output of the VCO circuit is compared in phase with a reference signal by a phase detector or phase comparator provided in a PLL frequency synthesizer. On the other hand, the output frequency of the single PLL circuit is multiplied by a corresponding one of frequency multipliers to a desired band, thereby forming a local signal of a reference frequency. This local signal is then frequency-mixed with a received signal in a desired one of the AM and SW bands by a frequency multiplier for the desired band.

A frequency-divided output of the single VCO circuit, which is produced by a programmable frequency divider, may be used instead of the output itself of the single VCO circuit.

With the first prior-art receiver disclosed in the Japanese Non-Examined Patent Publication No. 56-136041, the single VCO can be commonly used for the AM and SW bands. However, there is a problem that any other components of the receiver, such as a phase shifter for producing an In-phase carrier signal and a Quadrature-phase carrier signal from a carrier signal in an orthogonal converter, is not commonly used.

A second one of the prior-art receivers is disclosed in the Japanese Non-Examined Patent Publication No. 8-317002 published in Nov. 1996. This prior-art receiver is comprised of a local oscillator for generating a wave of a frequency twice as much as an intermediate frequency (IF), which is provided on a same device of a quadrature modulation circuit. This local oscillator and a phase detector constitute a PLL circuit for generating a signal synchronized with an output clock of a crystal oscillator. The signal generated by the PLL circuit is then frequency-divided by two by a 90°-phase shifter to thereby produce two carrier waves having a phase difference of 90° for quadrature modulation. These two carrier waves are multiplied with inputted I and Q signals by corresponding frequency mixers, respectively.

With the second prior-art receiver disclosed in the Japanese Non-Examined Patent Publication No. 8-317002, a wave of a frequency twice as much as an IF frequency is generated by the local oscillator and then, this wave is frequency-divided by the phase shifter to form the two carrier waves with a phase difference of 90°. Therefore, no frequency doubling circuit such as the Gilbert multiplier nor band-pass filter are required. Thus, obtainable modulation/demodulation accuracy is improved and no change is required for different frequency bands for portable telephones.

However, an IF signal is used in the second prior-art receiver Therefore, the configuration in this receiver is not applicable to a receiver using the direct conversion method.

A third one of the prior-art receivers is disclosed in the Japanese Non-Examined Patent Publication No. 9-200070 published in Jul. 1997. This prior-art receiver is designed to convert received signals in different frequency bands to a common Intermediate-Frequency (IF) signal, thereby simplifying the circuit configuration.

A received signal is classified by a first switching means according to its frequency band. Then, the received signal is sent to a first frequency mixer through a corresponding one of filters and a corresponding one of amplifiers and a second switching means. The first and second switching means are controlled by a frequency switching signal. On the other hand, a first local signal generated by a first local oscillator is supplied to the first frequency mixer. Thus, a first IF signal of a first IF is produced by mixing the received signal and first local signal in the first frequency mixer.

The first local signal has a first local frequency that corresponds to the frequency band of the received signal. The first local frequency is changed according to change of the frequency band of the received signal in such a way that the output of the first frequency mixer is always equal to the first IF.

The output of the first frequency mixer (i.e., the first IF signal) is sent to a second frequency mixer through a filter. On the other hand, a second local signal of a second local frequency is supplied to the second frequency mixer. Thus, a second IF signal of a second IF is produced by mixing the first IF signal and the second local signal.

With the third prior-art receiver disclosed in the Japanese Non-Examined Patent Publication No. 9-200070, the first local frequency is changed according to the change of the frequency band of the received signal in such a way that the output of the first frequency mixer is always equal to the first IF. Therefore, the subsequent stages to the first frequency mixer in the receiver can be commonly used for different frequency bands of the received signal.

However, similar to the above-described second prior-art receiver, the first and second IF signals are used in the third prior-art receiver. Therefore, the configuration of this receiver is not applicable to a receiver using the direct conversion method.

SUMMARY OF THE INVENTION

Accordingly, an object of the present invention is to provide a selective-calling radio receiver using the direct conversion method that makes it possible to commonly use a VCO and its neighboring component for different frequency bands.

Another object of the present invention is to provide a selective-calling radio receiver using the direct conversion method that facilitates the components/parts management and production control in fabrication of the receiver.

The above objects together with others not specifically mentioned will become clear to those skilled in the art from the following description.

A selective-calling radio receiver according to the present invention is comprised of (a) a PLL frequency synthesizer for generating an initial local signal, the PLL frequency synthesizer comprising a VCO generating the initial local signal and a PLL circuit controlling the initial local signal; (b) an orthogonal converter for orthogonally converting a digitally-modulated received signal to a combination of first and second baseband signals having a phase difference of 90° using the initial local signal, the orthogonal converter including (b-1) a first frequency multiplier for multiplying the initial local signal by a variable multiplication factor to produce a multiplied initial local signal, (b-2) a first phase shifter for producing first and second local signals having a phase difference of 90° from the multiplied initial local signal, (b-3) a first frequency mixer for mixing the first local signal with the received signal to produce the first baseband signal, and (b-4) a second frequency mixer for mixing the second local signal with the received signal to produce the second baseband signal; (c) an orthogonal-converter controller for controlling a characteristic of the orthogonal converter according to a frequency band of the received signal, the orthogonal-converter controller controlling the orthogonal converter so as to set the variable multiplication factor of the first frequency multiplier as a desired value and to optimize a characteristic of the first phase shifter according to the frequency band of the received signal; (d) a demodulator for demodulating the first and second baseband signals to produce a demodulated signal; and (e) a decoder for decoding the demodulated signal to derive information transmitted by the received signal.

With the selective-calling radio receiver according to the present invention, the orthogonal converter includes the first frequency multiplier for multiplying the initial local signal by the variable multiplication factor to produce the multiplied initial local signal and the first phase shifter for producing the first and second local signals from the multiplied initial local signal.

Moreover, the orthogonal-converter controller is additionally provided to control the characteristic of the orthogonal converter according to the frequency band of the received signal. Specifically, the orthogonal-converter controller controls the orthogonal converter so as to set the multiplication factor of the first frequency multiplier as a desired value and to optimize the characteristic of the first phase shifter according to the frequency band of the received signal.

Accordingly, the VCO of the frequency synthesizer, and the first frequency multiplier and the first phase shifter of the orthogonal converter (i.e., the neighboring components of the VCO) are able to be commonly used for different frequency bands of the received signal. This means that these components or parts are able to be commonly used even if the frequency of the received signal is changed. As a result, the components/parts management and production control in fabrication of this receiver is facilitated by adjusting the characteristic of the orthogonal converter according to the frequency band of the received signal.

In a preferred embodiment of the receiver according to the present invention, the first phase shifter is comprised of a capacitance-variable capacitor whose capacitance is changed by a control signal. In this case, there is an additional advantage that the characteristic of the first phase shifter is readily changed.

In another preferred embodiment of the receiver according to the present invention, a second phase shifter is additionally provided. The first and second local signals are produced by the first and second phase shifters, respectively. Each of the first and second phase shifters is comprised of a capacitance-variable capacitor whose capacitance is changed by a control signal. In this case, there is an additional advantage that the characteristics of the first and second phase shifters are readily optimized.

It is preferred that one of the first and second phase shifters has a configuration of a high-pass filter including a capacitor and a resistor and the other thereof has a configuration of a low-pass filter including a capacitor and a resistor. In this case, there is an additional advantage that the first and second phase shifters are readily configured.

In still another preferred embodiment of the receiver according to the present invention, a second frequency multiplier is additionally provided. One of the first and second frequency multipliers is selectively used according to the frequency band of the received signal. In this case, there is an additional advantage that the changeable frequency range of the multiplied initial local signal becomes wider.

It is preferred that one of the first and second frequency multipliers is selectively activated by supplying/sinking a current to/from the selected one of the first and second frequency multipliers. In this case, there is an additional advantage that the selection of the first and second multipliers is readily carried out.

In a further preferred embodiment of the receiver according to the present invention, a second phase shifter and a second frequency multiplier are additionally provided. The first and second local signals are produced by the first and second phase shifters, respectively. Each of the first and second phase shifters is comprised of a capacitance-variable capacitor whose capacitance is changed by a control voltage supplied from a voltage source. One the first and second frequency multipliers is selectively activated according to the frequency band of the received signal by supplying a current supplied/sunk by a current source/sink to/from a desired one of the first and second frequency multipliers. The voltage source and the current source/sink are formed on an IC chip on which a main part of the PLL frequency synthesizer is formed. In this case, the advantages of the present invention are effectively exhibited.

Preferably, a set of data for the control signal are stored in a rewritable Read-Only Memory (ROM), and they are designed to be read out by a main controller. In this case, there is an additional advantage that the frequency band of the receiver can be readily changed by simply rewriting the content of the rewritable ROM.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described bellow while referring to the drawings attached.

First Embodiment

Figure 1:
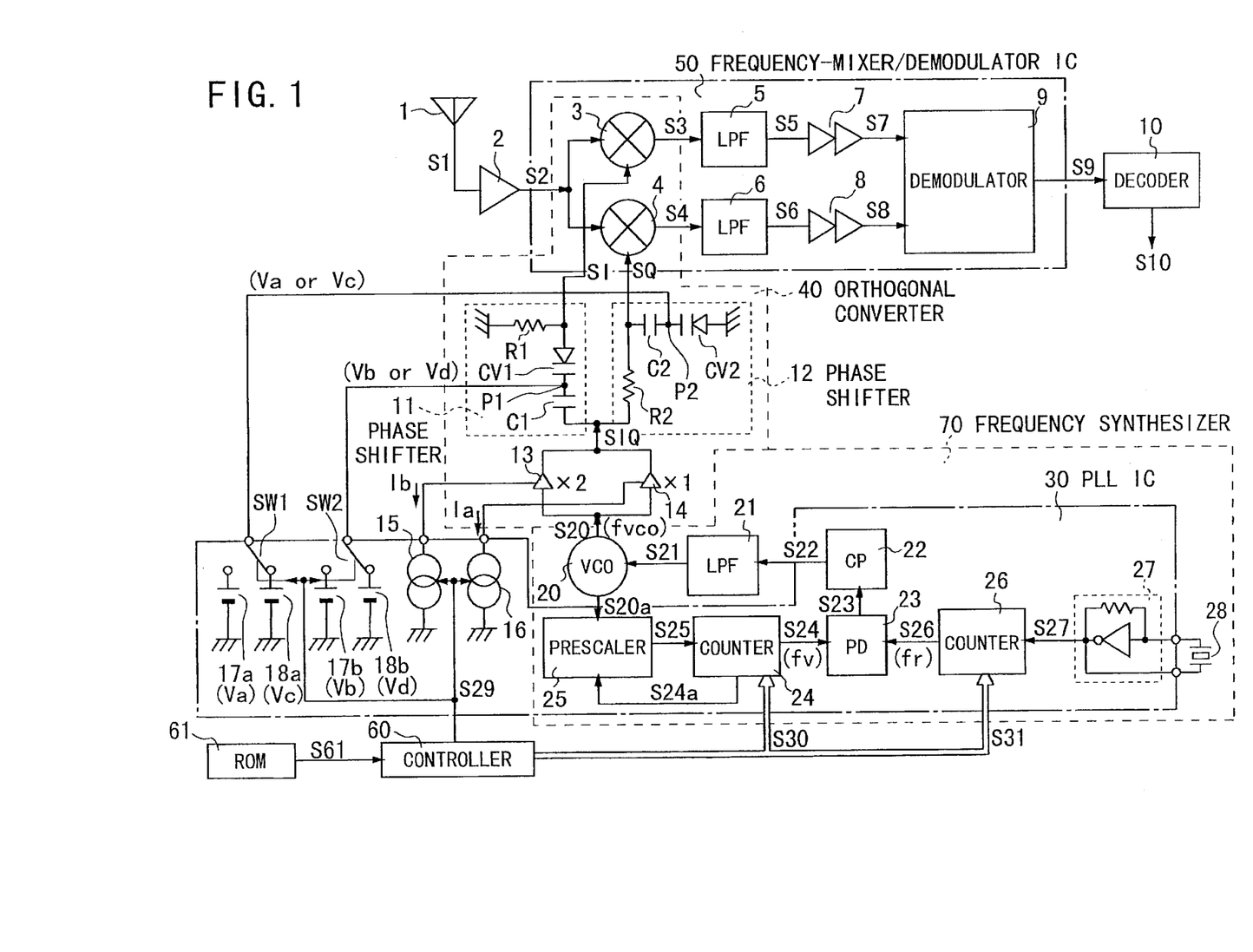
FIG. 1 is a block diagram showing the circuit configuration of a selective-calling radio receiver according to a first embodiment of the present invention.

A selective-calling radio receiver according to a first embodiment of the present invention has a configuration as shown in FIG. 1. This receiver serves as a paging receiver using the direct conversion method and is applicable to two frequency bands of 150 MHz and 300 MHz. The 150 MHz band has a frequency range from 135 MHz to 175 MHz. The 300 MHz band has a frequency range from 270 MHz to 350 MHZ.

In FIG. 1, this receiver is comprised of an antenna 1, an RF amplifier 2, a frequency-mixer/demodulator IC 50, a decoder 10, two variable phase shifters 11 and 12, four constant voltage sources 17a, 17b, 18a, and 18b, two frequency multipliers 13 and 14, two constant current sinks 15 and 16, a PLL frequency synthesizer 70, and a controller 60.

The antenna 1 receives a desired digital-modulated RF signal S1 that contains the specific information. The RF amplifier 2 amplifies the received RF signal S1 and outputs an amplified RF signal S2 to the frequency mixer/demodulator IC 50.

The frequency mixer/demodulator IC 50 includes two frequency mixers 3 and 4, two low-pass filters 5 and 6, two baseband amplifiers 7 and 8 and a demodulator 9.

The amplified RF signal S2 is inputted into the frequency mixers 3 and 4. On the other hand, a local in-phase signal SI and a local quadrature-phase signal SQ, which are respectively supplied from the phase shifters 11 and 12, are inputted into the frequency mixers 3 and 4, respectively.

The frequency mixer 3 mixes the frequency of the amplified RF signal S2 and the frequency of the local in-phase signal SI and outputs a baseband I signal S3 to the low-pass filter 5. The low-pass filter 5 removes the high-frequency components of the baseband I signal S3 an outputs a filtered baseband I signal S5 to the baseband amplifier 7. The baseband amplifier 7 amplifies the filtered baseband I signal S5 and outputs an amplified, filtered baseband I signal S7 to the demodulator 9.

The frequency mixer 4 mixes the frequency of the amplified RF signal S2 and the frequency of the local quadrature-phase signal SQ and outputs a baseband Q signal S4 to the low-pass filter 6. The low-pass filter 6 removes the high-frequency components of the baseband Q signal S4 and outputs a filtered baseband Q signal S6 to the baseband amplifier 8. The baseband amplifier 8 amplifies the filtered baseband Q signal S6 and outputs an amplified, filtered baseband Q signal SS to the demodulator 9.

The demodulator 9 demodulates the amplified, filtered baseband I signal S7 and the amplified, filtered baseband Q signal S8 and outputs a demodulated signal S9 to the decoder 10. The demodulated signal S9 is a digital signal containing the specific information in the digital-modulated RF signal S1 received by the antenna 1.

The decoder 10 decodes the demodulated signal S9 to extract the information contained in the demodulated signal S9 and outputs an output signal S10 containing the extracted information. The transmitted information thus extracted is typically displayed on a screen (not shown) of this receiver.

The local in-phase signal SI and the local quadrature-phase signal SQ are generated by the PLL frequency synthesizer 70, a selected one of the frequency multipliers 13 and 14, and the phase shifters 11 and 12.

The PLL frequency synthesizer 70 is comprised of a Voltage-Controlled Oscillator (VCO) 20, a low-pass filter 21, a charge pump 22, a phase detector or phase comparator 23, a counter 24, a prescaler 25, a counter 26, and a reference oscillator 27 using a crystal 28.

The reference oscillator 27 in the PLL frequency synthesizer 70 oscillates at a frequency according to the oscillation frequency of the crystal 28 and outputs a pulsed signal S27 to the counter 26. The counter 26 counts the pulses of the signal S27 and divides the pulses by a division factor according to a counter data signal S31, thereby outputting a reference signal S26 of a reference frequency fr to the phase detector 23.

The counter data signal S31 is inputted into the counter 26 by the controller 60. The counter data contained in the counter data signal S31 is stored in advance in an Electrically Erasable Programmable Read-Only Memory (EEPROM) 61. The controller 60 reads out the counter data stored in the EEPROM 61 through a signal S61 and then, applies the data thus read out to the counter 26.

The VCO 20 in the PLL frequency synthesizer 70 outputs a local signal S20 of a local frequency fvco proportional to the reference frequency fr to an activated or selected one of the two frequency multipliers 13 and 14. At the same time as this, the local signal S20 outputted by the VCO 20 is fed back to the prescaler 25 as a signal S20a. The prescaler 25 divides the frequency fvco of the local signal S20a thus fed back and outputs a frequency-divided local signal S25 to the counter 24. The counter 24 further divides the frequency of the frequency-divided local signal S25 and outputs a frequency-divided local signal S24 of a frequency fv to the phase detector 23.

The phase detector 23 compares the phases of the reference signal S26 of the reference frequency fr and the frequency-divided local signal S24 of the frequency fv and then, outputs a signal S23 to the charge pump 22 according to the result of the phase comparison. The charge pump 22 outputs a voltage signal S22 through the low-pass filter 21 to the VCO 20 according to the signal S23 of the phase detector 23 (i.e., proportional to the phase difference between the signals S26 and S24), thereby equalizing the frequency fv of the frequency-divided local signal S24 to the reference frequency fr of the reference signal S26. Thus, the frequency fv of the frequency-divided local signal S24 is kept equal to the reference frequency fr of the reference signal S26. Accordingly, the local frequency fvco of the VCO 20 is fixed at a selected one of preset values.

The prescaler 25 and the counter 24 constitute a programmable frequency divider of the known pulse-swallow configuration, which serves to decrease the frequency fvco of the local signal S20 of the VCO 20 to a frequency lower than the highest operable frequency of the counter 24. The counter 24 sends a switching signal S24a to the prescaler 25 as necessary in such a way that the frequency-division factor of the prescaler 25 is changed.

The counter 24 counts the pulses of the signal S25 and divides the frequency of the signal S25 by a division factor according to a counter data signal S30, thereby outputting the signal S24 of the frequency fv to the phase detector 23. The counter data signal S30 is inputted into the counter 24 by the controller 60. The counter data contained in the counter data signal S30 is stored in advance in the EEPROM 61. The controller 60 reads out the counter data stored in the EEPROM 61 through the signal S61 and then, applies the data to the counter 24.

As described above, the VCO 20, the low-pass filter 21, the charge pump 22, the phase detector 23, the counter 24, and the prescaler 25 constitute a PLL.

The variable phase shifters 11 and 12, the frequency multipliers 13 and 14, and the frequency mixers 3 and 4 constitute an orthogonal converter 40. One of the two frequency multipliers 13 and 14 is selectively activated and used for this receiver.

The orthogonal converter 40 receives the output or local signal S20 of the frequency fvco outputted by the VCO 20, multiplies the frequency fvco of the signal S20 by the multiplication factor of two or unity by the multiplier 13 or 14, and produces the in-phase local signal SI and the quadrature-phase local signal SQ by the variable phase shifters 11 and 12, respectively.

In the first embodiment, the frequency multiplier 13 has a function to multiply the local frequency fvco of the local signal S20 by two. Therefore, the multiplier 13 produces an output signal SIQ of a frequency 2 fvco which is twice as much as the frequency fvco of the signal S20 of the VCO. On the other hand, the multiplier 14 has a function to multiply the local frequency fvco of the local signal S20 by unity; in other words, the multiplier 14 serves as a buffer. Therefore, the output signal SIQ of the multiplier 14 has a frequency fvco equal to the frequency of the signal S20.

The selection of the frequency multipliers 13 and 14 is carried out by activating a desired one of two constant current sinks 15 and 16 through a selection signal S29. The selection signal S29 is sent by the controller 60. The selection data contained in the selection signal S29 is stored in advance in the EEPROM 61. The controller 60 reads out the selection data stored in the EEPROM 61 through the signal S61 and then, selects or activates one of the two current sinks 15 and 16.

If the frequency multiplier 13 is intended to be used, only the corresponding current sink 15 is activated by the selection signal S29, thereby sinking a constant current Ia from the multiplier 13. If the frequency multiplier or buffer 14 is intended to be used, only the corresponding current sink 16 is activated by the selection signal S29, thereby sinking a constant current Ib from the multiplier 14.

Two constant voltage sources 17a and 18a supply constant control voltages Va and Vc to the variable uhase shifter 12, respectively. One of the voltage sources 17a and 18a is selected by a switch SW1. Similarly, two constant voltage sources 17b and 18b supply constant control voltages Vb and Vd to the variable phase shifter 11, respectively. The control voltage Vc is lower than the control voltage Va. The control voltage Vd is lower than the control voltage Vb. One of the voltage sources 17b and 18b is selected by a switch SW2. The switching operations of the switches SW1 and SW2 are simultaneously carried out by the use of the selection signal S29.

The two constant current sinks 15 and 16 and the four constant voltage sources 17a, 17b, 18a, and 18b are provided on the PLL IC 30. Therefore, there is an additional advantage that no dedicated unit or chip are additionally required for providing the constant current sinks 15 and 16 and the constant voltage sources 17a, 17b, 18a, and 18b. In other words, no assembly process is added due to existence of the constant current sinks 15 and 16 and the constant voltage sources 17a, 17b, 18a, and 18b.

Since the switching operations of the switches SW1 and SW2 and the activating operation of the constant current sink 15 or 16 are performed by using the same selection signal S29, these two operations are performed approximately simultaneously. Specifically, if the voltage sources 17a and 17b are selected by the switches SW1 and SW2 the constant current sink 15 is activated to select the frequency doubling multiplier 13. If the voltage sources 18a and 18b are selected by the switches SW1 and SW2, the constant current sink 16 is activated to select the multiplier or buffer 14.

The variable phase shifter 11 is comprised of a capacitor C1, a variable capacitor CV1, and a resistor R1, which are serially connected to one another. Two terminals of the variable capacitor CV1 are connected to a corresponding terminal of the resistor R1 and a corresponding terminal of the capacitor C1. The other terminal of the resistor R1 is connected to the ground. The connection point of the resistor R1 and the variable capacitor CV1 is connected to the input terminal of the frequency mixer 3. The other terminal of the capacitor C1 is commonly connected to the output terminals o the multipliers 13 and 14. Since the variable phase shifter 11 has a configuration formed by adding the variable capacitor CV1 to a high-pass filter (HPF) consisting of the capacitor C1 and the resistor R1, the phase shifter 11 serves as a high-pass filter having a variable filtering frequency range.

Similarly, the variable phase shifter 12 is comprised of a capacitor C2, a variable capacitor CV2, and a resistor R2, which are serially connected to one another. Two terminals of the capacitor V2 are connected to a corresponding terminal of the resistor R2 and a corresponding terminal of the variable capacitor CV2. The other terminal of the variable capacitor CV2 is connected to the ground. The connection point of the resistor R2 and the capacitor C2 is connected to the input terminal of the frequency mixer 4. The other terminal of the resistor R2 is commonly connected to the output terminals of the multipliers 13 and 14. Since the variable phase shifter 12 has a configuration formed by adding the variable capacitor CV2 to a low-pass filter (LPF) consisting of the capacitor C2 and the resistor R2, the phase shifter 12 serves as a low-pass filter having a variable filtering frequency range.

The voltage Va or Vc is applied to the connection point of the capacitor C2 and the varicap CV2 in the phase sifter 12. The voltage Vb or Vd is applied to the connection point of the capacitor C1 and the varicap CV1 in the phase shifter 11.

The VCO 20, the low-pass filter 21, the controller 60, and the EEPROM 61 are provided outside the PLL IC 30.

Next, the operation of the selective-calling radio receiver according to the first embodiment in FIG. 1 is explained below.

The PLL frequency synthesizer 70 outputs the local signal S20 of the local frequency fcvo to the frequency multipliers 13 and 14. Since the operation of the frequency synthesizer 70 is well known, no further explanation is provided here.

As already described above, the receiver according to the first embodiment is applicable to the frequency bands of 150 MHz and 300 MHz. With conventional selective-calling radio receivers of this sort, the circuit parameters of a VCO of a PLL frequency synthesizer and phase shifters of an orthogonal converter are respectively optimized according to an intended frequency band. In other words, a VCO and phase shifters having dedicated circuit parameters need to be used if the intended frequency band is changed between 150 MHz and 300 MHz.

Unlike this, with the receiver according to the first embodiment, the local frequency fvco of the local signal S20, which is the output of the VCO 20 in the PLL frequency synthesizer 70, is initially optimized for the frequency band of 150MHZ. Also, in the orthogonal converter 40, the multiplier 14 with the multiplication factor of unity (i.e., buffer) is used by activating the corresponding constant current sink 16 through the selection signal S29.

If this receiver is used for the frequency band of 300 MHz, the multiplier 13 with the multiplication factor of two is used by activating the corresponding constant current sink 15 through the selection signal S29 instead of the buffer 14 while the local frequency fvco of the local signal S20 is kept unchanged.

Moreover, the circuit parameters of the variable phase shifters 11 and 12 in the orthogonal converter 40 are initially optimized for the frequency band of 150 MHz. The phase shifters 11 and 12 are applied with the lower control voltages Vd and Vc from the voltage sources 18b and 18a by operating the switches SW1 and SW2 through the selection signal S29, respectively, thereby decreasing the inter-terminal voltages of the variable capacitors CV1 and CV2. As a result, the capacitances of the capacitors CV1 and CV2 are increased.

It this receiver is used for the frequency band of 300 MHz, the phase shifters 11 and 12 are applied with the higher control voltages Vb and Va from the voltage sources 17b and 17a by operating the switches SW1 and SW2 through the selection signal S29, respectively, thereby increasing the inter-terminal voltages of the variable capacitors CV1 and CV2. As a result, the capacitances of the capacitors CV1 and CV2 are decreased.

The multiplied local signal SIQ produced by the activated one of the multipliers 13 and 14 is commonly inputted into the phase shifters 11 and 12. The multiplied signal SIQ has a frequency of fcvo or 2 fcvo, which is equal to the carrier frequency of the received signal S1.

The variable phase shifter 11 delays or advances the phase of the inputted signal SIQ by 45°, thereby outputting the in-phase local signal SI of the frequency fcvo or 2 fcvo to the frequency mixer 3. The variable phase shifter 12 advances or delays the phase of the inputted signal SIQ by 45°, thereby outputting the quadrature-phase local signal SQ of the same frequency fcvo or 2 fcvo as the local signal SI to the frequency mixer 4. Thus, the in-phase and quadrature-phase local signals SI and SQ have a same frequency and a phase difference of 90°.

The frequency mixer 3 mixes the frequency of the received amplified signal S2 with the frequency fcvo or 2 fcvo of the in-phase local signal SI, thereby outputting the in-phase baseband signal S3. The frequency mixer 4 mixes the frequency of the received amplified signal S2 with the frequency fcvo or 2 fcvo of the quadrature phase local signal SQ, thereby outputting the quadrature-phase baseband signal S4. The in-phase and quadrature-phase baseband signals S3 and S4 have a same frequency as one another and a phase difference of 90°.

The in-phase baseband signal S3 is inputted into the demodulator 9 through the low-pass filter 5 and the baseband amplifier 7. The quadrature-phase base band signal S4 is inputted into the demodulator S9 through the low-pass filter 6 and the baseband amplifier 8. The demodulator 9 outputs the demodulated digital signal S9 to the decoder 10, thereby extracting the transmitted information from the signal S9 as the signal 10. As explained above, since the receiver according to the first embodiment uses the direct conversion method, the two baseband signals S3 and S4 outputted by the frequency mixers 3 and 4 of the orthogonal converter 40 need to have a phase difference of 90°. To produce this phase difference of 90°, the in-chase and quadrature-phase local signals SI and SQ with a phase difference of 90° are produced by the variable phase shifters 11 and 12.

The variable phase shifter 11 is realized by adding the variable capacitor CV1 to a typical configuration of a high-pass filter consisting of the resistor R1 and the capacitor C1. The variable phase shifter 12 is realized by adding the variable capacitor CV2 to a typical configuration of a low-pass filter consisting of the resistor R2 and the capacitor C2.

The phase change of the applied signal SIQ in the phase shifter 11 is controlled by supplying a desired one of the different control voltages Vb and Vd (Vd<Vb) through the selection signal S29. The relatively lower voltage vd is selected to optimize the frequency characteristic of the phase shifter 11 for the frequency band of 150 MHz. The relatively higher voltage Vb is selected to optimize the frequency characteristic of the phase shifter 11 for the frequency band of 300 MHz.

The phase change of the applied signal SIQ in the phase shifter 12 is controlled by supplying a desired one of the different control voltages Va and Vc (Vc<Va) through the selection signal S29. The relatively lower voltage Vc is selected to optimize the frequency characteristic of the phase shifter 12 for the frequency band of 150 MHz. The relatively higher voltage Va is selected to optimize the frequency characteristic of the phase shifter 12 for the frequency band of 300 MHz.

As seen from the above explanation, with the selective-calling radio receiver according to the first embodiment, the whole PLL frequency synthesizer 70 and the whole orthogonal converter 40 are able to be commonly used for the frequency bands of 150 MHz and 300 MHz by selecting one of the pair of the control voltages Va and Vb and the pair of the control voltages Vc and Vd according to the intended frequency band.

Figure 2:
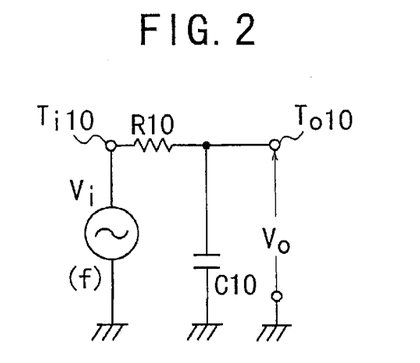
FIG. 2 is a circuit diagram of a phase shifter with the low-pass filter configuration used in the selective-calling radio receiver according to the first embodiment of the present invention.

FIG. 2 shows the circuit configuration of a typical phase shifter with the low-pass filter configuration. In FIG. 2, a resistor R10 and a capacitor C10 are serially connected to one another at their opposing terminals. The other terminal of the capacitor C10 is connected to the ground. The other terminal of the resistor R10 serves as an input terminal $T_{i i 0}$ of the phase shifter. The connection point of the capacitor C10 and the resistor R10 serves as an output terminal $T_{o 10}$ of this phase shifter.

An ac voltage $V_i$ of a frequency f is inputted across the input terminal $T_{i i 0}$ and the ground. An output voltage $V_o$ is derived from the output terminal $T_{o 10}$ with respect to the ground.

The inventor measured the voltage gain $A_0$ (dB) and the phase shift $\theta_o$ (°) of the phase shifter using the circuit shown in FIG. 2. The result of this measurement is shown in the Bode diagram of FIG. 3, where the curve A indicates the voltage gain $A_0$, the curve B indicates the phase shift $\theta_0$, and the abscissa of the input frequency f is normalized by the cut-off frequency $f_c$.

The cut-off frequency $f_c$ of the phase shifter in FIG. 2 is given by the following equation (1)

$$f_c = \left(\frac{1}{2\pi CR}\right) \quad (1)$$

where C is the capacitance of the capacitor C10 and R is the resistance of the resistor R10.

Figure 3:
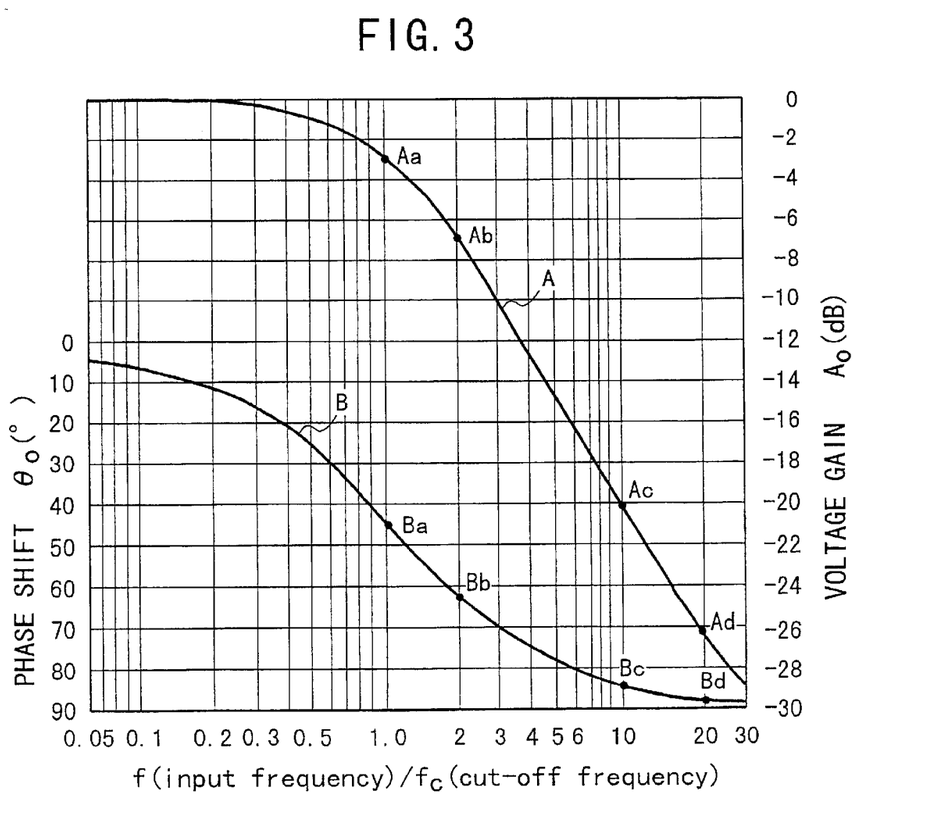
FIG. 3 is a Bode diagram showing the relationship between the voltage gain and phase difference of the phase sifter used in the selective-calling radio receiver according to the first embodiment of the present invention as a function of the normalized input frequency f by the cut-off frequency $f_c$.

As seen from: the curves A and B in FIG. 3, when the normalized input frequency (f/f$_c$) is equal to 1, the phase shift $\theta_0$ is 45° (at the point Ba) and the voltage gain $A_0$ is decreased by 3 dB (at the point Aa) with respect to the input voltage $V_i$. This means that if the input voltage $V_i$ of the cut-off frequency $f_c$ is applied to the phase shifter of FIG. 2, the output voltage $V_o$ has an amplitude lowered by 3 dB with respect to the input voltage $V_i$ and a phase delayed by 45° (i.e., −45°) with respect to the input voltage $V_i$.

The other value examples at the points Ab, Bb, Ac, Bc, Af, and Bd in FIG. 3 are listed in Table 1.

TABLE 1

| f/f$_c$ | A$_o$ | $\theta_o$ | points |
|---|---|---|---|
| 2.0 | −7 dB | 64° | Ab, Bb |
| 10.0 | −20 dB | 84° | Ac, Bc |
| 20.0 | −26 dB | 89° | Ad, Bd |

If the resistor R10 is replaced with the capacitor C10 in FIG. 2, a typical phase shifter with the high-pass filter configuration is obtained. In the phase shifter with the high-pass filter configuration, if the input voltage $V_i$ of the cut-off frequency $f_c$ is applied to this phase shifter, the output voltage $V_o$ has an amplitude lowered by 3 dB with respect to the input voltage $V_i$ and a phase advanced by 45° (i.e., +45°) with respect to the input voltage $V_i$.

Accordingly, the output voltages $V_o$ of the two phase shifters of the low-pass filter and high-pass filter configurations have a resultant phase shift of 90°.

In general, the voltage gain $A_0$ and the phase shift $\theta_0$ of the output voltage $V_o$ are given by the following equations (2) and (3), respectively.

$$A_0 = -20 \log \sqrt{1 + \left(\frac{f}{f_c}\right)^2} \quad (2)$$

$$\theta_0 = \tan^{-1}\left(\frac{f}{f_c}\right) \quad (3)$$

Using the above equation (1), the cut-off frequency $f_c$ of the variable phase shifter 11 with the high-pass filter configuration and that of the variable phase shifter 12 with the low-pass filter configuration are given by the following equation (4)

$$f_c = \left(\frac{1}{2\pi R0\,C0}\right) \quad (4)$$

where C0 is the total capacitance of the capacitor C1 or C2 and the variable capacitor CV1 or CV2 and R0 is the resistance of the resistor R1 or R2.

Figure 4:
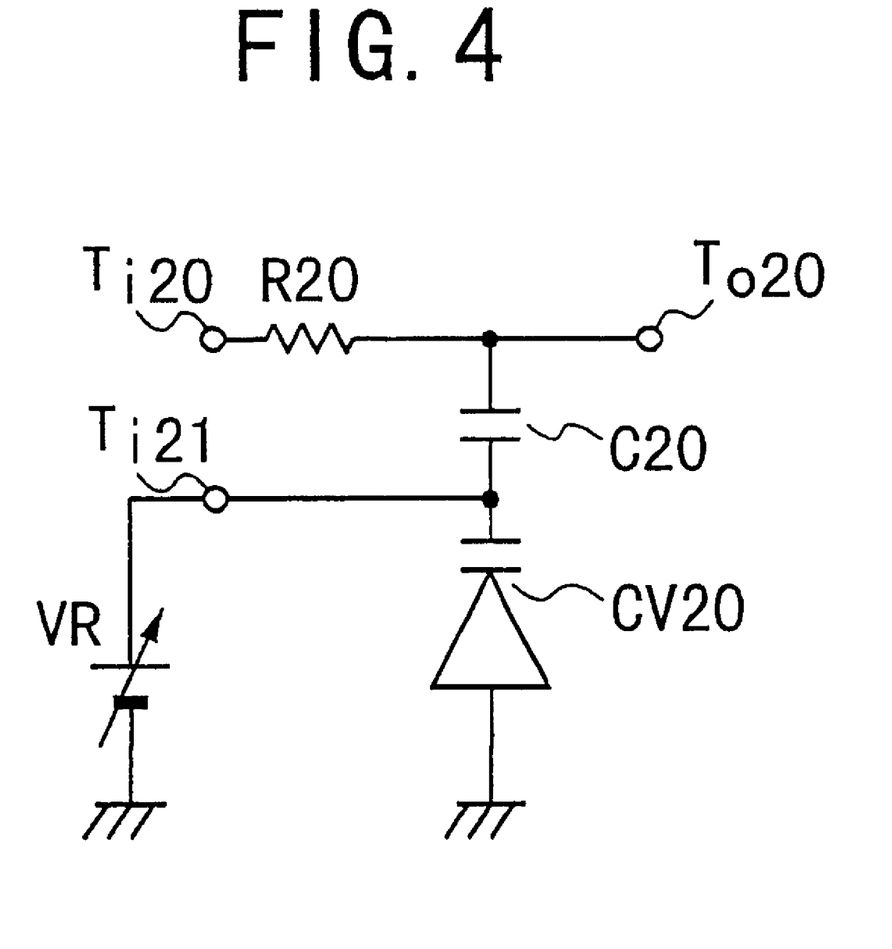
FIG. 4 is a circuit diagram of a phase shifter with the low-pass filter configuration used in the selective-calling radio receiver according to the first embodiment of the present invention, in which the phase shifter is comprised of a resistor, a capacitor, and a variable capacitor.

The cut-off frequency $f_c$ of the phase shifter 12 can be measured by the use of the circuit shown in FIG. 4 while changing a reverse voltage VR, which is the same configuration as that of the variable phase shifter 12 with the low-pass filter configuration. A resistor R20, a capacitor C20, and a variable capacitor CV20 in FIG. 4 correspond to the resistor R2, the capacitor C2, and the variable capacitor CV2 in the variable phase shifter 12 in FIG. 2. The reverse voltage VR, which is applied across the connection point of the capacitor C20 and the variable capacitor CV20 in FIG. 4, corresponds to the control voltage 17a or 18a in FIG. 1. A terminal of the resistor R20 serves as an input terminal $T_{i 20}$ and the connection point of the resistor R20 and the capacitor C20 serves as an output terminal $T_{o 20}$.

It is obvious that the cut-off frequency $f_c$ of the phase shifter shown in FIG. 4 is generally given by the following equation (5).

$$f_c = \frac{1}{2\pi R \left(\frac{C20 \cdot CV20}{C20 + CV20}\right)} \quad (5)$$

where R is the resistance of the resistor R20, C20 and CV20 are capacitances of the capacitors C20 and CV20, respectively.

Using the equation (5), the cut-off frequency $f_c$ of the variable phase shifters 11 and 12 of the receiver according to the first embodiment of FIG. 1 is generally given by the following equations (6) and (7), respectively.

$$f_c = \frac{1}{2\pi R1 \left(\frac{C1 \cdot CV1}{C1 + CV1}\right)} \quad (6)$$

$$f_c = \frac{1}{2\pi R1 \left(\frac{C2 \cdot CV2}{C2 + CV2}\right)} \quad (7)$$

where R1 and R2 are resistances of the resistors R1 and R2, C1 and C2 are capacitances of the capacitors C1 and C2, and CV1 and CV2 are capacitances of the variable capacitors CV1 and CV2, respectively.

Since the capacitances CV1 and CV2 of the variable capacitors CV1 and CV2 are able to be adjusted by changing the control voltages va, Vb, Vc, and Vd, the values of the capacitances CV1 and CV2 are determined according to the capacitance-voltage (C-V) characteristics of the variable capacitors CV1 and CV2.

Figure 5:
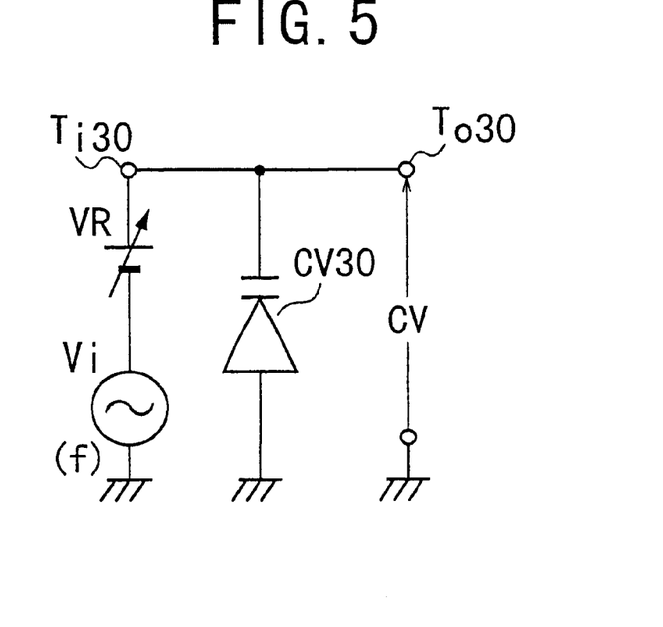
FIG. 5 is a circuit diagram showing the measuring method of the variable capacitor used in the selective-calling radio receiver according to the first embodiment of the present invention.

FIG. 5 shows a circuit diagram used to measure the C-V characteristic of the variable capacitors CV1 and CV2, in which CV30 denotes a variable capacitor, $T_{i30}$ is an input terminal, $T_{o30}$ is an output terminal. An ac voltage $V_i$ of a frequency f is applied across the input terminal $T_{i30}$ and the ground. A variable dc reverse voltage VR is applied across the input terminal $T_{i30}$ and the ground.

Figure 6:
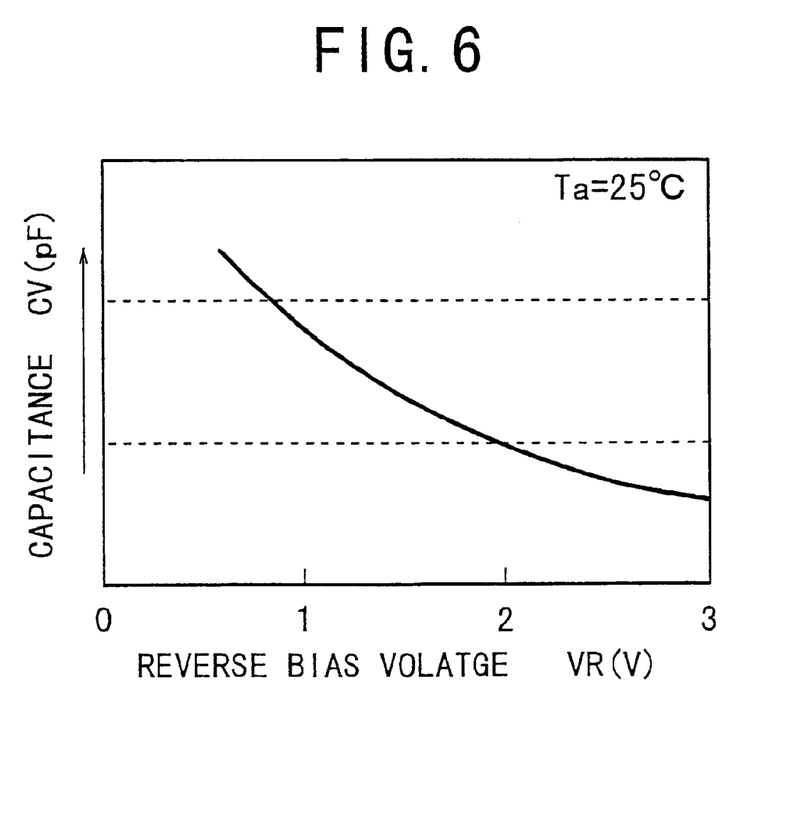
FIG. 6 is a graph showing the relationship between the capacitance and the reverse bias voltage of the variable capacitor used in the selective-calling radio receiver according to the first embodiment of the present invention.

FIG. 6 shows the C-V characteristic of the variable capacitor CV30 in FIG. 5, where CV (pF) denotes the capacitance of the capacitor CV30. This graph was obtained by the inventor's measurement at a temperature of 25° C.

As seen from FIG. 6 that the capacitance of the capacitor CV30 gradually decreases according to the increasing reverse voltage VR. This means that the cut-off frequency $f_c$ is raised according to the increasing reverse voltage VR.

Next, an explanation about the channel separation is provided below.

In general, the channel separation (i.e., frequency pitch between the adjoining channels) is legally regulated for the radio receiver of this sort. Therefore, this receiver needs to designed and fabricated to satisfy the legal regulation.

With the receiver according to the first embodiment shown in FIG. 1, if the frequency pitch is 12.5 kHz, the local frequency fvco of the local signal S20 of the VCO 20 is able to be changed at a frequency pitch of 12.5 kHz by suitably setting the values of the counters 24 and 26. However, to cope with the frequency band of 300 MHz, the local frequency fcvo of the VCO 20 of the PLL frequency synthesizer 70 is multiplied by two in the frequency-doubling multiplier 14. In this case, therefore, the local frequency fcvo of the VCO 20 is changed at a frequency pitch of 25 (=12.5×2) kHz. This frequency pitch does not accord with the above legal regulation.

As a result, it is necessary that the local frequency fvco of the local signal S20 of the VCO 20 is designed to be changed at a frequency pitch of 6.25 (=12.5÷2) kHz by suitably setting the values of the counters 24 and 26.

The legal regulation has defined the four frequency bands of 150 MHz, 300 MHz, 450 MHz, and 900 MHz applicable to the paging receiver of this sort. Therefore, the receiver according to the first embodiment may be applied to the frequency bands of 450 MHz and 900 MHz instead of 150 MHz and 300 MHz.

Second Embodiment

Figure 7:
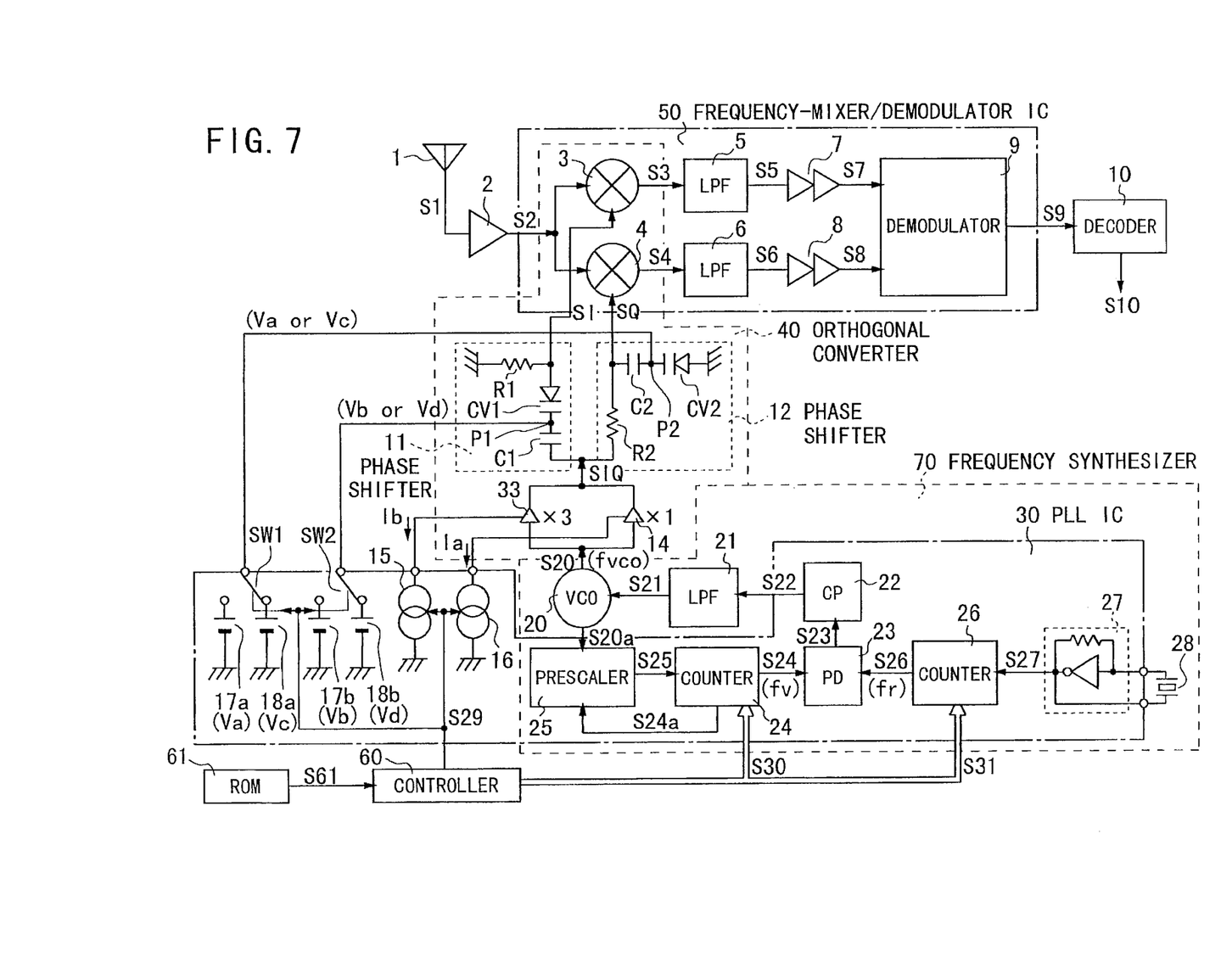
FIG. 7 is a block diagram showing the circuit configuration of a selective-calling radio receiver according to a second embodiment of the present invention.

FIG. 7 shows a selective-calling radio receiver according to a second embodiment of the present invention.

This radio receiver has the same configuration as that of the radio receiver according to the first embodiment shown in FIG. 1 except that a frequency multiplier 33 having a multiplication factor of three is used instead of the multiplier 13 having a multiplication factor of two. Therefore, explanation about the same configuration as that of the first embodiment is omitted here by attaching the same reference numerals to the same elements in FIG. 7 for the sake of simplification of description.

It is obvious that the receiver according to the second embodiment has the same advantages as those in the first embodiment. Also, since the multiplier 33 having a multiplication factor of three is used, this receiver is able to cope with the two frequency bands of 150 MHz and 450 MHz or the two frequency bands of 300 MHz and 900 MHz.

While the preferred embodiments of the present invention have been described, it is to be understood that modifications will be apparent to those skilled in the art without departing from the spirit of the invention. The scope of the invention, therefore, is to be determined solely by the following claims.

What is claimed is:

1. A selective-calling radio receiver comprising:
   (a) a PLL frequency synthesizer for generating an initial local signal, said PLL frequency synthesizer comprising a VCO generating said initial local signal and a PLL circuit controlling said initial local signal;
   (b) an orthogonal converter for orthogonally converting a digitally-modulated received signal to a combination of first and second baseband signals having a phase difference of 90° using said initial local signal;
   said orthogonal converter including:
     (b-1) a first frequency multiplier for multiplying said initial local signal by a variable multiplication factor to produce a multiplied initial local signal;
     (b-2) a first phase shifter for producing first and second local signals having a phase difference of 90° from said multiplied initial local signal;
     (b-3) a first frequency mixer for mixing said first local signal with said received signal to produce said first baseband signal; and
     (b-4) a second frequency mixer for mixing said second local signal with said received signal to produce said second baseband signal;
   (c) an orthogonal-converter controller for controlling a characteristic of said orthogonal converter according to a frequency band of said received signal;
   said orthogonal-converter controller controlling said orthogonal converter so as to set said variable multiplication factor of said first frequency multiplier as a desired value and to optimize a characteristic of said first phase shifter according to said frequency band of said received signal;

(d) a demodulator for demodulating said first and second baseband signals to produce a demodulated signal; and (e) a decoder for decoding said demodulated signal to derive information transmitted by said received signal, and wherein a set of data for said control signal are stored in a rewritable Read-Only Memory;

and wherein said set of data are designed to be read out by a main controller.

2. The receiver as claimed in claim 1, wherein said first phase shifter is comprised of a capacitance-variable capacitor whose capacitance is changed by a control signal.

3. The receiver as claimed in claim 1, further comprising a second phase shifter;

wherein said first and second local signals are produced by said first and second phase shifters, respectively;

each of said first and second phase shifters being comprised of a capacitance-variable capacitor whose capacitance is changed by a control signal.

4. A selective-calling radio receiver comprising:

(a) a PLL frequency synthesizer for generating an initial local signal, said PLL frequency synthesizer comprising a VCO generating said initial local signal and a PLL circuit controlling said initial local signal;

(b) an orthogonal converter for orthogonally converting a digitally-modulated received signal to a combination of first and second baseband signals having a phase difference of 90° using said initial local signal;

said orthogonal converter including:
(b-1) a first frequency multiplier for multiplying said initial local signal by a variable multiplication factor to produce a multiplied initial local signal;
(b-2) a first phase shifter for producing first and second local signals having a phase difference of 90° from said multiplied initial local signal;
(b-3) a first frequency mixer for mixing said first local signal with said received signal to produce said first baseband signal; and
(b-4) a second frequency mixer for mixing said second local signal with said received signal to produce said second baseband signal;

(c) an orthogonal-converter controller for controlling a characteristic of said orthogonal converter according to a frequency band of said received signal;

said orthogonal-converter controller controlling said orthogonal converter so as to set said variable multiplication factor of said first frequency multiplier as a desired value and to optimize a characteristic of said first phase shifter according to said frequency band of said received signal;

(d) a demodulator for demodulating said first and second baseband signals to produce a demodulated signal; and (e) a decoder for decoding said demodulated signal to derive information transmitted by said received signal, wherein said one of said first and second phase shifters has a configuration of a high-pass filter including a capacitor and a resistor and the other thereof has a configuration of a low-pass filter including a capacitor and a resistor.

5. The receiver as claimed in claim 1, further comprising a second frequency multiplier;

wherein one of said first and second frequency multipliers is selectively used according to said frequency of said received signal.

6. A selective-calling radio receiver comprising:

(a) a PLL frequency synthesizer for generating an initial local signal, said PLL frequency synthesizer comprising a VCO generating said initial local signal and a PLL circuit controlling said initial local signal;

(b) an orthogonal converter for orthogonally converting a digitally-modulated received signal to a combination of first and second baseband signals having a phase difference of 90° using said initial local signal;

said orthogonal converter including:
(b-1) a first frequency multiplier for multiplying said initial local signal by a variable multiplication factor to produce a multiplied initial local signal;
(b-2) a first phase shifter for producing first and second local signals having a phase difference of 90° from said multiplied initial local signal;
(b-3) a first frequency mixer for mixing said first local signal with said received signal to produce said first baseband signal; and
(b-4) a second frequency mixer for mixing said second local signal with said received signal to produce said second baseband signal;

(c) an orthogonal-converter controller for controlling a characteristic of said orthogonal converter according to a frequency band of said received signal;

said orthogonal-converter controller controlling said orthogonal converter so as to set said variable multiplication factor of said first frequency multiplier as a desired value and to optimize a characteristic of said first phase shifter according to said frequency band of said received signal;

(d) a demodulator for demodulating said first and second baseband signals to produce a demodulated signal; and (e) a decoder for decoding said demodulated signal to derive information transmitted by said received signal, further comprising a second frequency multiplier;

wherein one of said first and second frequency multipliers is selectively used according to said frequency of said received signal, wherein one of said first and second frequency multipliers is selectively activated by supplying/sinking a current to/from said selected one of said first and second frequency multipliers.

7. A selective-calling radio receiver comprising:

(a) a PLL frequency synthesizer for generating an initial local signal, said PLL frequency synthesizer comprising a VCO generating said initial local signal and a PLL circuit controlling said initial local signal;

(b) an orthogonal converter for orthogonally converting a digitally-modulated received signal to a combination of first and second baseband signals having a phase difference of 90° using said initial local signal;

said orthogonal converter including:
(b-1) a first frequency multiplier for multiplying said initial local signal by a variable multiplication factor to produce a multiplied initial local signal;
(b-2) a first phase shifter for producing first and second local signals having a phase difference of 90° from said multiplied initial local signal;
(b-3) a first frequency mixer for mixing said first local signal with said received signal to produce said first baseband signal; and
(b-4) a second frequency mixer for mixing said second local signal with said received signal to produce said second baseband signal;

(c) an orthogonal-converter controller for controlling a characteristic of said orthogonal converter according to a frequency band of said received signal;

said orthogonal-converter controller controlling said orthogonal converter so as to set said variable multiplication factor of said first frequency multiplier as a desired value and to optimize a characteristic of said first phase shifter according to said frequency band of said received signal;

(d) a demodulator for demodulating said first and second baseband signals to produce a demodulated signal; and (e) a decoder for decoding said demodulated signal to derive information transmitted by said received signal, further comprising a second phase shifter and a second frequency multiplier;

wherein said first and second local signals are produced by said first and second phase shifters, respectively;

each of said first and second phase shifters being comprised of a capacitance-variable capacitor whose capacitance is changed by a control voltage supplied from a voltage source;

and wherein one of said first and second frequency multipliers is selectively activated according to said frequency band of said received signal by supplying a current supplied/sunk by a current source/sink to/from a desired one of said first and second frequency multipliers;

and wherein said voltage source and said current source/sink are formed on an IC chip on which a main part of said PLL frequency synthesizer is formed.

8. A selective-calling radio receiver comprising:

(a) a PLL frequency synthesizer for generating an initial local signal, said PLL frequency synthesizer comprising a VCO generating said initial local signal and a PLL circuit controlling said initial local signal;

(b) an orthogonal converter for orthogonally converting a digitally-modulated received signal to a combination of first and second baseband signals having a phase difference of 90° using said initial local signal;

said orthogonal converter including:

(b-1) a first frequency multiplier for multiplying said initial local signal by a first multiplication factor to produce a first multiplied initial local signal;

(b-2) a second frequency multiplier for multiplying said initial local signal by a second multiplication factor to produce a second multiplied initial local signal;

(b-3) a first phase shifter for producing a first local signal from a selected one of said first and second multiplied initial local signal;

(b-4) a second phase a shifter for producing a second local signal having a phase difference of 90° with respect to said first local signal from said selected one of said first and second multiplied initial local signal;

(b-5) a first frequency mixer for mixing said first local signal with said received signal to produce said first baseband signal; and (b-6) a second frequency mixer for mixing said second local signal with said received signal to produce said second baseband signal;

(c) an orthogonal-converter controller for controlling a characteristic of said orthogonal converter according to a frequency band of said received signal;

said orthogonal-converter controller controlling said orthogonal converter so as to selectively send one of said first and second multiplied initial local signals to said first and second phase shifters and to optimize characteristics of said first and second phase shifters according to said frequency band of said received signal;

(d) a demodulator for demodulating said first and second baseband signals to produce a demodulated signal; and (e) a decoder for decoding said demodulated signal to derive information transmitted by said received signal, wherein a set of data for said control signal are stored in a rewritable Read-Only Memory;

and wherein said set of data are designed to be read out by a main controller.

9. The receiver as claimed in claim 8, wherein each of said first and second phase shifters is comprised of a capacitance-variable capacitor whose capacitance is changed by a control signal.

10. A selective-calling radio receiver comprising:

(a) a PLL frequency synthesizer for generating an initial local signal, said PLL frequency synthesizer comprising a VCO generating said initial local signal and a PLL circuit controlling said initial local signal;

(b) an orthogonal converter for orthogonally converting a digitally-modulated received signal to a combination of first and second baseband signals having a phase difference of 90° using said initial local signal;

said orthogonal converter including:

(b-1) a first frequency multiplier for multiplying said initial local signal by a first multiplication factor to produce a first multiplied initial local signal;

(b-2) a second frequency multiplier for multiplying said initial local signal by a second multiplication factor to produce a second multiplied initial local signal;

(b-3) a first phase shifter for producing a first local signal from a selected one of said first and second multiplied initial local signal;

(b-4) a second phase a shifter for producing a second local signal having a phase difference of 90° with respect to said first local signal from said selected one of said first and second multiplied initial local signal;

(b-5) a first frequency mixer for mixing said first local signal with said received signal to produce said first baseband signal; and (b-6) a second frequency mixer for mixing said second local signal with said received signal to produce said second baseband signal;

(c) an orthogonal-converter controller for controlling a characteristic of said orthogonal converter according to a frequency band of said received signal;

said orthogonal-converter controller controlling said orthogonal converter so as to selectively send one of said first and second multiplied initial local signals to said first and second phase shifters and to optimize characteristics of said first and second phase shifters according to said frequency band of said received signal;

(d) a demodulator for demodulating said first and second baseband signals to produce a demodulated signal; and (e) a decoder for decoding said demodulated signal to derive information transmitted by said received signal, wherein said one of said first and second phase shifters has a configuration of a high-pass filter including a capacitor and a resistor and the other thereof has a configuration of a low-pass filter including a capacitor and a resistor.

11. A selective-calling radio receiver comprising:
(a) a PLL frequency synthesizer for generating an initial local signal, said PLL frequency synthesizer comprising a VCO generating said initial local signal and a PLL circuit controlling said initial local signal;
(b) an orthogonal converter for orthogonally converting a digitally-modulated received signal to a combination of first and second baseband signals having a phase difference of 90° using said initial local signal;
said orthogonal converter including:
  (b-1) a first frequency multiplier for multiplying said initial local signal by a first multiplication factor to produce a first multiplied initial local signal;
  (b-2) a second frequency multiplier for multiplying said initial local signal by a second multiplication factor to produce a second multiplied initial local signal;
  (b-3) a first phase shifter for producing a first local signal from a selected one of said first and second multiplied initial local signal;
  (b-4) a second phase a shifter for producing a second local signal having a phase difference of 90° with respect to said first local signal from said selected one of said first and second multiplied initial local signal;
  (b-5) a first frequency mixer for mixing said first local signal with said received signal to produce said first baseband signal; and
  (b-6) a second frequency mixer for mixing said second local signal with said received signal to produce said second baseband signal;
(c) an orthogonal-converter controller for controlling a characteristic of said orthogonal converter according to a frequency band of said received signal;
said orthogonal-converter controller controlling said orthogonal converter so as to selectively send one of said first and second multiplied initial local signals to said first and second phase shifters and to optimize characteristics of said first and second phase shifters according to said frequency band of said received signal;
(d) a demodulator for demodulating said first and second baseband signals to produce a demodulated signal; and
(e) a decoder for decoding said demodulated signal to derive information transmitted by said received signal,
wherein one of said first and second frequency multipliers is selectively activated by supplying/sinking a current to/from said selected one of said first and second frequency multipliers.

* * * * *